US010777166B2

(12) United States Patent
Hwang

(10) Patent No.: US 10,777,166 B2
(45) Date of Patent: Sep. 15, 2020

(54) DISPLAY DEVICE HAVING REDUCED TIME TO WRITE CORRECTION DATA TO MEMORY THEREIN

(71) Applicant: SAMSUNG DISPLAY CO., LTD., Yongin-si, Gyeonggi-do (KR)

(72) Inventor: Jun Hyuck Hwang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/376,361

(22) Filed: Apr. 5, 2019

(65) Prior Publication Data
US 2020/0043439 A1 Feb. 6, 2020

(30) Foreign Application Priority Data
Jul. 31, 2018 (KR) .................. 10-2018-0089327

(51) Int. Cl.
*G09G 5/00* (2006.01)
*G11C 16/32* (2006.01)
*G11C 16/10* (2006.01)
*G06T 1/60* (2006.01)
*G11C 16/30* (2006.01)

(52) U.S. Cl.
CPC .............. *G09G 5/006* (2013.01); *G06T 1/60* (2013.01); *G11C 16/10* (2013.01); *G11C 16/30* (2013.01); *G11C 16/32* (2013.01); *G09G 2310/08* (2013.01); *G09G 2330/021* (2013.01)

(58) Field of Classification Search
CPC .............. G09G 5/006; G09G 2310/08; G09G 2330/021; G09G 2320/045; G09G 2320/0233; G09G 2300/0819; G09G 2320/0285; G09G 5/001; G09G 2350/00; G11C 16/32; G11C 16/10; G11C 16/30; G11C 29/52; G06T 1/60
See application file for complete search history.

(56) References Cited

U.S. PATENT DOCUMENTS

| 10,007,631 B2 | 6/2018 | Park et al. | |
|---|---|---|---|
| 2006/0146128 A1* | 7/2006 | Ma | G09G 3/3611 348/89 |
| 2007/0001980 A1* | 1/2007 | Bae | G09G 3/3611 345/98 |
| 2014/0225878 A1* | 8/2014 | Shih | G09G 3/3233 345/205 |
| 2014/0320464 A1* | 10/2014 | Ryu | G09G 3/3688 345/204 |
| 2015/0061982 A1* | 3/2015 | Woo | G11C 19/28 345/82 |

FOREIGN PATENT DOCUMENTS

KR   10-2016-0128538   11/2016

* cited by examiner

*Primary Examiner* — Maurice L. McDowell, Jr.
(74) *Attorney, Agent, or Firm* — F.Chau & Associates, LLC

(57) ABSTRACT

A display device may include a memory configured to store correction data during a first period, a timing controller configured to generate second data by correcting the first data using the correction data, during a second period, and a terminal unit configured to transmit, to the memory, the correction data and a memory voltage received from an external device, during the first period. During the first period, the memory may be supplied with the memory voltage through a memory voltage line and driven by the memory voltage.

20 Claims, 7 Drawing Sheets

DISPLAY DEVICE HAVING REDUCED TIME TO WRITE CORRECTION DATA TO MEMORY THEREIN

CROSS-REFERENCE TO RELATED APPLICATION

The present application claims priority under 35 U.S.C. § 119 to Korean Patent Application No. 10-2018-0089327, filed on Jul. 31, 2018 in the Korean Intellectual Property Office, the disclosure of which is incorporated by reference herein in its entirety.

TECHNICAL FIELD

Exemplary embodiments of the inventive concept relate to a display device.

DISCUSSION OF RELATED ART

The use of various display devices, such as liquid crystal display (LCD) devices and organic light-emitting display devices, has increased over time. Display devices may display a target image to users in such a way that a data voltage capable of expressing a target gradation is applied to each pixel so that an organic light-emitting diode of the pixel emits light corresponding to the data voltage, or the light of a backlight is polarized by controlling liquid crystal alignment in response to the data voltage.

To prevent spots from being formed on a display image, such a display device may use correction data stored in a memory to correct image data received from an external device. The correction data may be written to the memory after a process of manufacturing a module of the display device has been completed.

SUMMARY

According to an exemplary embodiment of the inventive concept, a display device may include a memory configured to store correction data during a first period, a timing controller configured to generate second data by correcting first data using the correction data, during a second period, and a terminal unit configured to transmit, to the memory, the correction data and a memory voltage received from an external device, during the first period. During the first period, the memory may be supplied with the memory voltage through a memory voltage line and driven by the memory voltage.

In an exemplary embodiment of the inventive concept, the terminal unit may transmit a write signal received from the external device, to the timing controller through a write signal line during the first period.

In an exemplary embodiment of the inventive concept, during the first period, the timing controller may be disabled when receiving the write signal through the write signal line.

In an exemplary embodiment of the inventive concept, the terminal unit may transmit the correction data to the memory through an interface line during the first period.

In an exemplary embodiment of the inventive concept, the interface line may be connected in common to the terminal unit, the memory, and the timing controller, centering on a common node.

In an exemplary embodiment of the inventive concept, the display device may further include a switch unit disposed on the interface line, and connected between the common node and the terminal unit, and configured to turn on in response to the write signal.

In an exemplary embodiment of the inventive concept, the terminal unit may receive the correction data and the memory voltage from a data recording unit.

In an exemplary embodiment of the inventive concept, the terminal unit may receive the write signal from the external device.

In an exemplary embodiment of the inventive concept, the terminal unit may receive the write signal from the data recording unit.

In an exemplary embodiment of the inventive concept, the display device may further include a power management unit configured to supply the memory voltage to the memory voltage line during the second period.

In an exemplary embodiment of the inventive concept, during the second period, the memory may be supplied with the memory voltage through the memory voltage line and driven by the memory voltage.

In an exemplary embodiment of the inventive concept, the display device may further include a data driver configured to generate data signals using the second data and to supply the data signals to data lines, a scan driver configured to supply scan signals to scan lines, and pixels coupled to the scan lines and the data lines.

In an exemplary embodiment of the inventive concept, the memory may be a flash memory.

According to an exemplary embodiment of the inventive concept, a display device may include a terminal unit configured to receive a write signal, correction data, and a memory voltage from an external device, transmit the write signal to a write signal line, transmit the correction data to an interface line, and transmit the memory voltage to a memory voltage line, during a first period to write the correction data, a timing controller coupled to the write signal line and configured to be disabled in response to the write signal, and a memory coupled to the memory voltage line and the interface line, and configured to be supplied with and driven by the memory voltage, and to receive and store the correction data.

In an exemplary embodiment of the inventive concept, the interface line may be connected in common to the terminal unit, the memory, and the timing controller, centering on a common node.

In an exemplary embodiment of the inventive concept, the display device may further include a switch unit disposed on the interface line, connected between the common node and the terminal unit, and configured to turn on in response to the write signal.

In an exemplary embodiment of the inventive concept, the interface line may be a signal transmission line using a serial peripheral interface communication scheme.

In an exemplary embodiment of the inventive concept, the write signal line may be a signal transmission line having an inter-integrated circuit (I2C) interface.

In an exemplary embodiment of the inventive concept, the memory may be a flash memory.

According to an exemplary embodiment of the inventive concept, a display device may include a terminal unit configured to transmit first data, a write signal, correction data, and a memory voltage, a timing controller configured to receive the first data and the write signal, and connected to a common node via an interface line, a memory configured to receive the correction data and the memory voltage, and connected to the common node via the interface line to receive the correction data and a switch unit connected between the terminal unit and the common node via the interface line, and configured to turn on in response to the write signal to electrically connect the terminal unit and the memory.

DETAILED DESCRIPTION OF THE EMBODIMENTS

Figure 1:
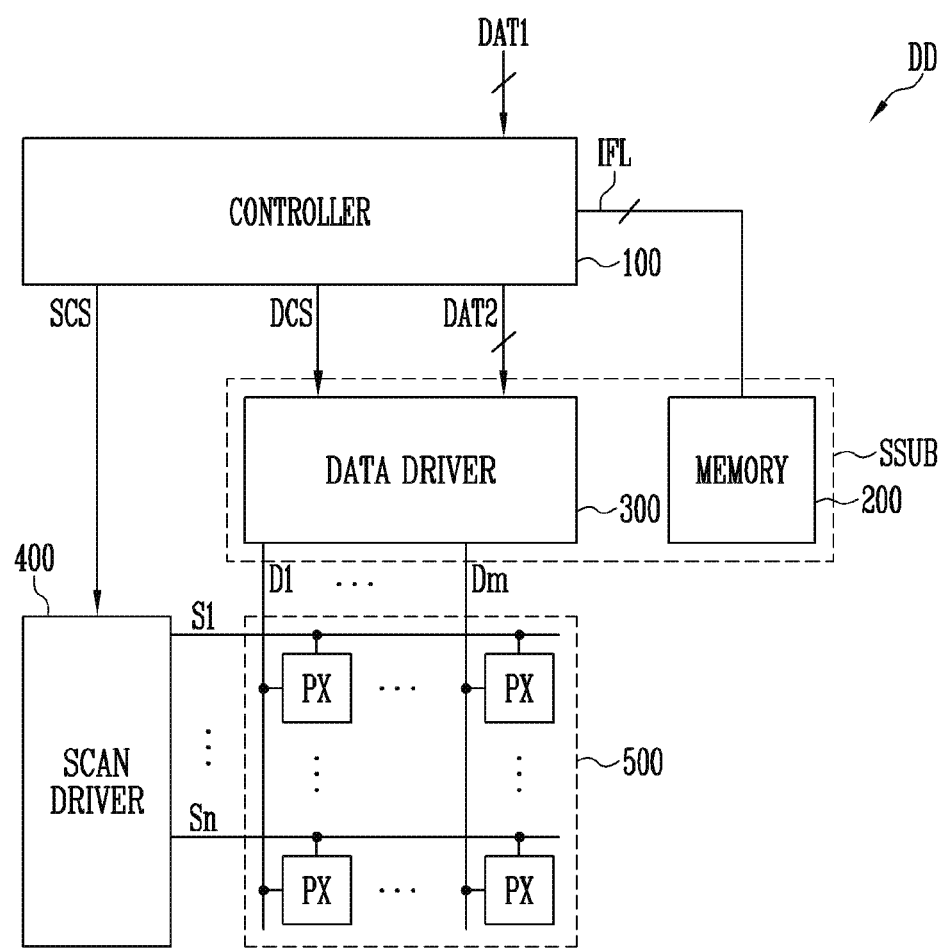
FIG. 1 is a diagram illustrating a display device according to an exemplary embodiment of the inventive concept.

Exemplary embodiments of the inventive concept are directed to a display device capable of improving a manufacturing process thereof by reducing the time it takes to write correction data to a memory therein.

Hereinafter, exemplary embodiments of the inventive concept will be described in greater detail with reference to the accompanying drawings. Like reference numerals may refer to like elements throughout this application.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a display device according to an exemplary embodiment of the inventive concept.

Referring to FIG. 1, a display device DD may include a controller 100, a memory 200, a data driver 300, a scan driver 400, and a pixel unit 500.

The controller 100 may control overall operations of the display device DD.

In detail, the controller 100 may receive first data DAT1 and external control signals from an external device. For example, the first data DAT1 may refer to an image data. The external control signals may include a vertical synchronization signal, a horizontal synchronization signal, a main clock signal, a data enable signal, and so forth.

The controller 100 may communicate with the memory 200 through an interface line IFL. For instance, the interface line IFL may refer to a signal transmission line using a serial programming interface (SPI) communication scheme. The SPI communication scheme may be a serial communication device or serial communication scheme by which a processor and a peripheral integrated circuit (IC) communicate with each other. The controller 100 may read correction data from the memory 200 through the interface line IFL.

The controller 100 may correct the first data DAT1, based on the correction data. For example, the correction data may include respective spot correction values of pixels PX. The controller 100 may generate second data DAT2 by correcting the first data DAT1.

The controller 100 may generate a data driving control signal DCS and a scan driving control signal SCS, based on at least one of the first data DAT1 and the external control signals. The controller 100 may transmit the second data DAT2 and the data driving control signal DCS to the data driver 300. The controller 100 may transmit the scan control signal SCS to the scan driver 400. The second data DAT2, the data driving control signal DCS, and the scan driving control signal SCS may be suitable for operation conditions of the data driver 300, the scan driver 400, and the pixel unit 500.

The memory 200 may be coupled to the interface line IFL. For example, the controller 100 may read the correction data from the memory 200 through the interface line IFL, and the external device may write the correction data to the memory 200 through the interface line IFL. In an exemplary embodiment of the inventive concept, the memory 200 may be a flash memory.

The data driver 300 may receive the data driving control signal DCS and the second data DAT2 from the controller 100. The data driver 300 may generate data signals, based on the data driving control signal DCS and the second data DAT2. The data driver 300 may supply data signals to data lines D1 to Dm (where m is a natural number). For example, the data driver 300 may supply the data signals to the data lines D1 to Dm in synchronization with a corresponding scan signal. The data signals supplied to the data lines D1 to Dm may be input to pixels PX of a pixel line selected by the corresponding scan signal. In an exemplary embodiment of the inventive concept, the data driver 300 may include a plurality of data driving ICs. The memory 200 and the data driver 300 may be disposed on a source substrate SSUB (e.g., a source board).

The scan driver 400 may receive the scan driving control signal SCS from the controller 100. The scan driver 400 may generate scan signals based on the scan driving control signal SCS. The scan driver 400 may supply the scan signals to the scan lines S1 to Sn (where n is a natural number). For example, the scan driver 400 may sequentially supply the scan signals to the scan lines S1 to Sn.

The pixel unit 500 may include a substrate, and the pixels PX disposed on the substrate. For example, the pixel unit 500 may refer to a display area of a display panel.

The pixels PX may be coupled with corresponding data lines D1 to Dm and corresponding scan lines S1 to Sn, and may be supplied with the data signals and the scan signals through the data lines D1 to Dm and the scan lines S1 to Sn, respectively. The pixels PX may be disposed on intersections of the scan lines S1 to Sn and the data lines D1 to Dm. Each pixel PX may emit light at a gradation corresponding to a related data signal.

The pixel unit 500 may further include the scan lines S1 to Sn and the data lines D1 to Dm that are disposed on the substrate. In an exemplary embodiment of the inventive concept, the scan lines S1 to Sn may extend in a first direction (e.g., in a horizontal direction). The data lines D1 to Dm may extend in a second direction (e.g., in a vertical direction) different from the first direction. In an exemplary embodiment of the inventive concept, each of the pixels PX may be coupled to at least one of the scan lines S1 to Sn and coupled to at least one of the data lines D1 to Dm.

Although in FIG. 1, the pixel unit 500, the controller 100, the scan driver 400, and/or the data driver 300 have been illustrated as separate components, the inventive concept is not limited thereto. For example, at least two of the pixel unit 500, the controller 100, the scan driver 400, and the data driver 300 may be integrated with each other or mounted on the substrate of the pixel unit 500. For example, the pixel unit 500 may be a display panel.

Figure 2:
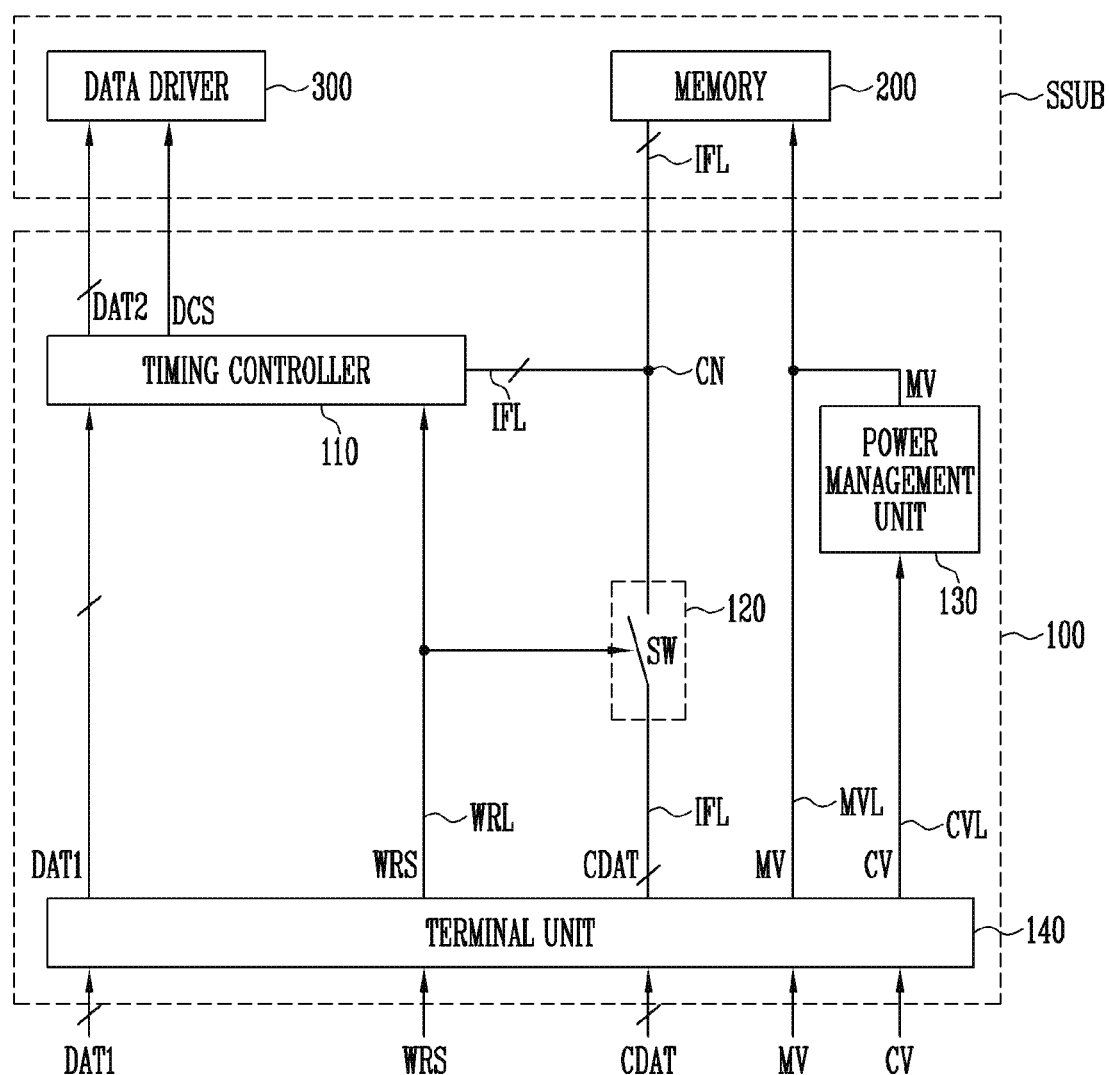
FIG. 2 is a diagram illustrating a controller of FIG. 1 according to an exemplary embodiment of the inventive concept.

FIG. 2 is a diagram illustrating a controller of FIG. 1 according to an exemplary embodiment of the inventive concept.

For the sake of description, FIG. 2 additionally illustrates the memory 200 and the data driver 300 of the components of the display device DD shown in FIG. 1.

Referring to FIG. 2, the controller 100 may include a control substrate, a timing controller 110, a switch unit 120, a power management unit 130, and a terminal unit 140. For example, the timing controller 110, the switch unit 120, the power management unit 130, and the terminal unit 140 may be disposed on the control substrate.

The timing controller 110 may be coupled to a write signal line WRL and the interface line IFL. The interface line IFL may be coupled in common to the terminal unit 140, the memory 200, and the timing controller 110, centering on a common node CN. The common node CN may be coupled to the terminal unit 140 via the switch unit 120.

During a first period to write correction data CDAT, the timing controller 110 may receive a write signal WRS from the terminal unit 140 through the write signal line WRL. For example, the write signal line WRL may refer to a signal transmission line of an inter-integrated circuit (I2C) interface. The timing controller 110 may be disabled when receiving the write signal WRS.

During a second period to read the correction data CDAT, the timing controller 110 may receive the first data DAT1 from the terminal unit 140. The timing controller 110 may communicate with the memory 200 through the interface line IFL.

The timing controller 110 may read the correction data CDAT from the memory 200 through the interface line IFL. The timing controller 110 may correct the first data DAT1 based on the correction data CDAT. For example, the correction data CDAT may be spot correction data. The timing controller 110 may remove spots by correcting the first data DAT1 based on the correction data CDAT. The timing controller 110 may generate the second data DAT2 by correcting the first data DAT1. The timing controller 110 may transmit the second data DAT2 and the data driving control signal DCS to the data driver 300.

The switch unit 120 may be disposed on the interface line IFL. For example, the switch unit 120 may be connected between the common node CN and the terminal unit 140. For example, the switch unit 120 may include at least one switch SW.

The common node CN may be a node that is coupled in common to the interface line IFL coupled to the timing controller 110, the interface line IFL coupled to the memory 200, and the interface line IFL coupled to the terminal unit 140.

During the first period, the switch unit 120 may receive the write signal WRS from the terminal unit 140 through the write signal line WRL. Here, the switch unit 120 may be turned on.

When the switch unit 120 is turned on, the terminal unit 140 and the memory 200 may be electrically connected to each other through the interface line IFL.

During the second period, the switch unit 120 may not receive the write signal WRS. Here, the switch unit 120 may be turned off.

The power management unit 130 may be coupled to a control voltage line CVL and a memory voltage line MVL. For example, the power management unit 130 may refer to a power management integrated circuit (PMIC).

During the first period, the power management unit 130 may not be supplied with a control voltage CV from the terminal unit 140 through the control voltage line CVL. However, the inventive concept is not limited thereto.

During the second period, the power management unit 130 may be supplied with the control voltage CV from the terminal unit 140 through the control voltage line CVL. The control voltage CV may be a voltage for driving the power management unit 130. For example, the control voltage CV may be about 12 V. When the control voltage CV is supplied to the power management unit 130, the power management unit 130 may supply a memory voltage MV to the memory voltage line MVL. The memory voltage MV may be a voltage for driving the memory 200. For example, the memory voltage MV may be about 3.3 V.

The terminal unit 140 may be coupled to the write signal line WRL, the interface line IFL, and the memory voltage line MVL. Furthermore, the terminal unit 140 may be coupled to the control voltage line CVL.

During the first period, the terminal unit 140 may receive the write signal WRS, the correction data CDAT, and the memory voltage MV from the external device. The terminal unit 140 may transmit the write signal WRS to the write signal line WRL, transmit the correction data CDAT to the interface line IFL, and transmit the memory voltage MV to the memory voltage line MVL.

During the second period, the terminal unit 140 may receive the first data DAT1 and the control voltage CV from the external device. The terminal unit 140 may transmit the first data DAT1 to the timing controller 110. The terminal unit 140 may transmit the control voltage CV to the control voltage line CVL.

The memory 200 may be coupled to the memory voltage line MVL and the interface line IFL.

During the first and the second periods, the memory 200 may be supplied with the memory voltage MV through the memory voltage line MVL, and driven by the memory voltage MV.

During the first period, the memory 200 may communicate with the terminal unit 140 through the interface line IFL. The memory 200 may receive the correction data CDAT transmitted through the interface line IFL and store the correction data CDAT therein.

During the second period, the memory 200 may communicate with the timing controller 110 through the interface line IFL. Here, the timing controller 110 may read the correction data CDAT from the memory 200.

During the second period, the data driver 300 may receive the second data DAT2 from the timing controller 110. Referring to FIG. 1, the data driver 300 may generate the data signals based on the second data DAT2 and the data driving control signal DCS, and supply the data signals to the data lines D1 to Dm.

Figure 3A:
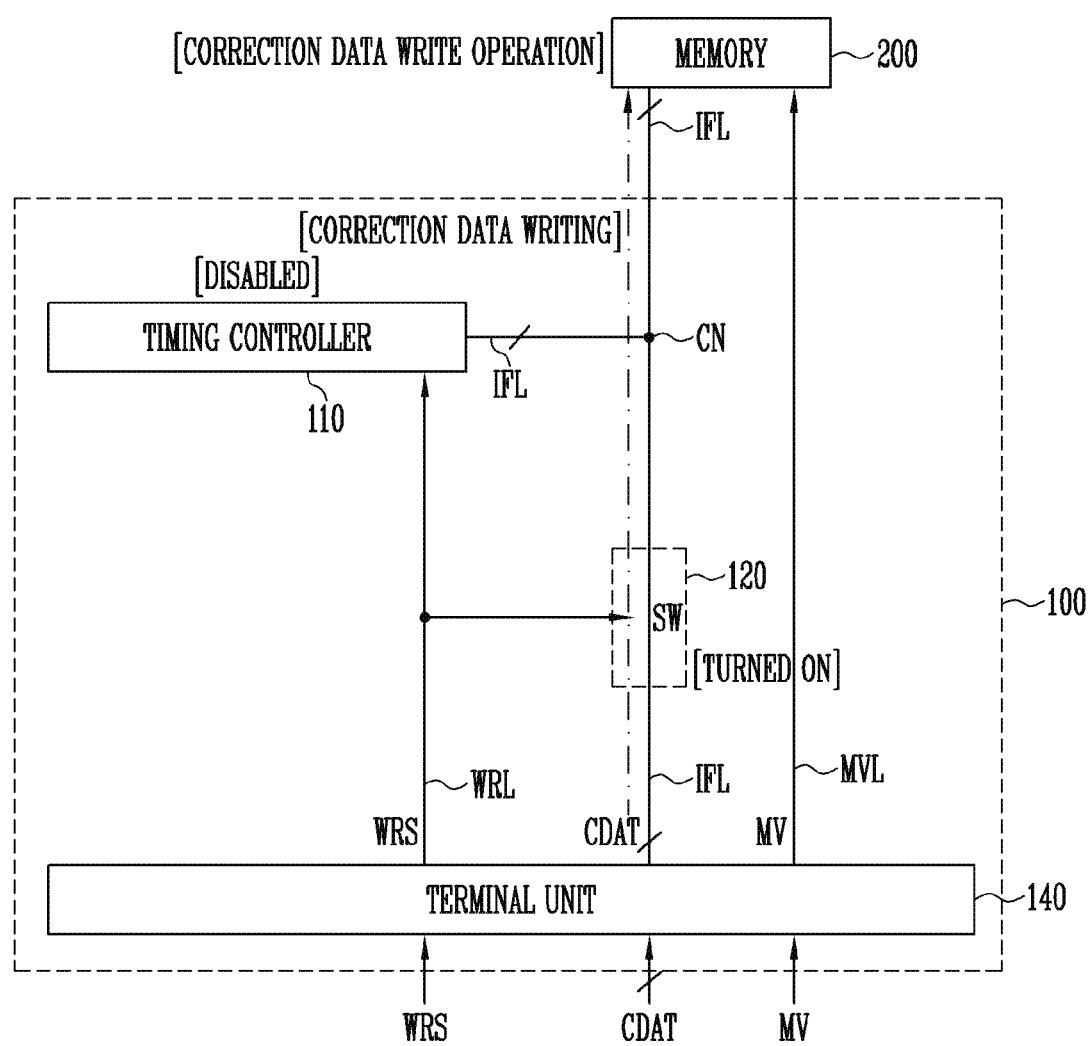
FIG. 3A is a diagram illustrating a write operation of the display device of FIG. 1 according to an exemplary embodiment of the inventive concept.

FIG. 3A is a diagram illustrating a write operation of the display device of FIG. 1 according to an exemplary embodiment of the inventive concept.

For the sake of description, FIG. 3A illustrates only configurations and signals involved in the operation of the controller 100 during the first period to write the correction data CDAT.

Referring to FIG. 3A, during the first period, the terminal unit 140 may receive the write signal WRS, the correction data CDAT, and the memory voltage MV from the external device. The terminal unit 140 may transmit the write signal WRS to the write signal line WRL, transmit the correction data CDAT to the interface line IFL, and transmit the memory voltage MV to the memory voltage line MVL.

During the first period, the timing controller 110 may receive the write signal WRS from the terminal unit 140 through the write signal line WRL. Here, the timing controller 110 may be disabled.

During the first period, the switch unit 120 may receive the write signal WRS from the terminal unit 140 through the write signal line WRL. Here, the switch unit 120 may be turned on. When the switch unit 120 is turned on, the terminal unit 140 and the memory 200 may be electrically connected to each other through the interface line IFL.

During the first period, the memory 200 may be supplied with the memory voltage MV through the memory voltage line MVL, and driven by the memory voltage MV. Furthermore, the memory 200 may communicate with the terminal unit 140 through the interface line IFL. The memory 200 may receive the correction data CDAT transmitted through the interface line IFL and store the correction data CDAT therein.

In this way, the write operation of the display device for writing the correction data CDAT to the memory 200 may be performed.

In other words, the display device according to an exemplary embodiment of the inventive concept may perform a spot correction data write operation without being powered on.

Therefore, during a process of manufacturing the display device, the time required to power on the display device may be reduced. Furthermore, the time it takes to stabilize the timing controller 110 may be reduced.

As such, the manufacturing time of the display device may be reduced.

Figure 3B:
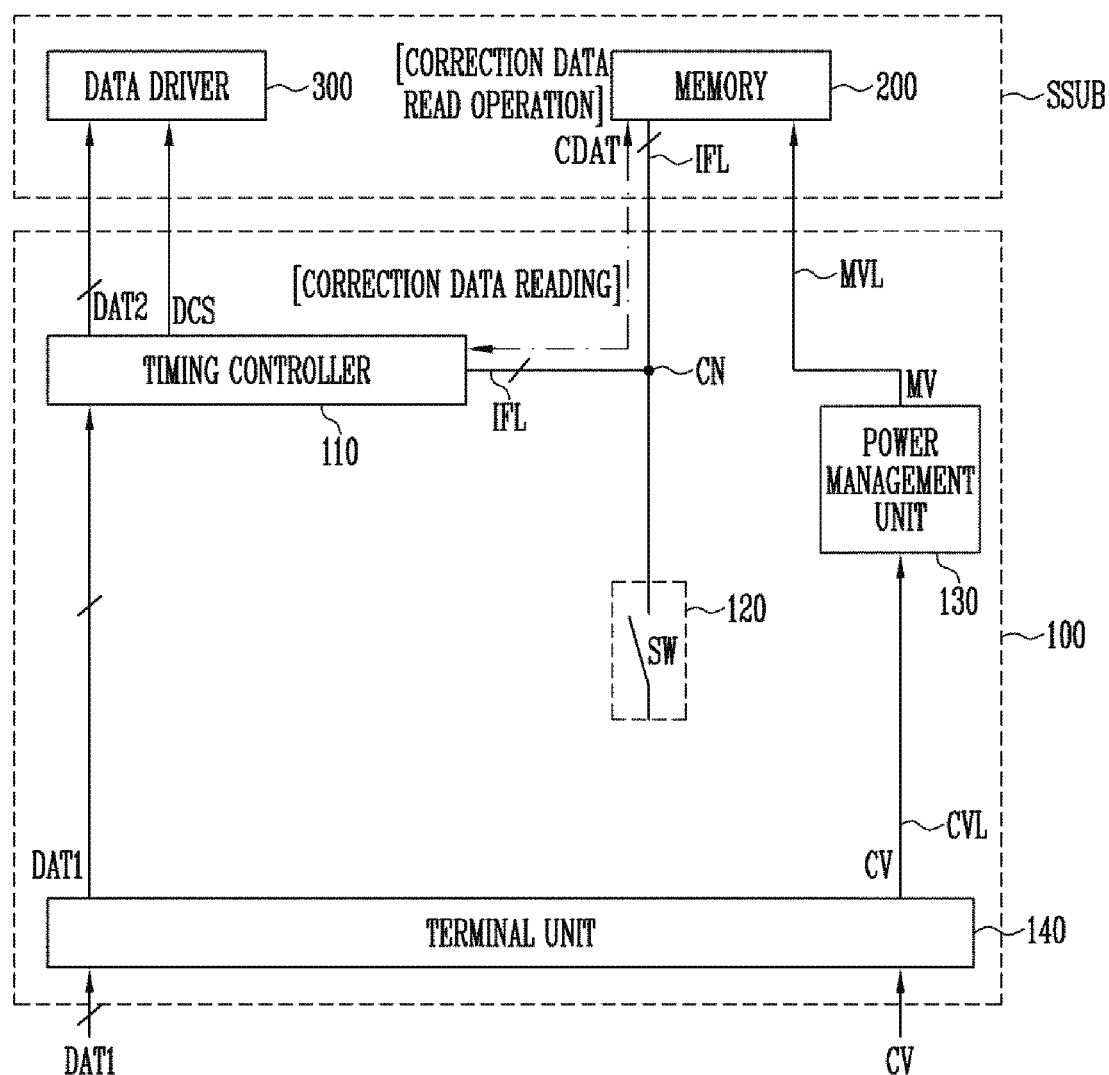
FIG. 3B is a diagram illustrating a read operation of the display device of FIG. 1 according to an exemplary embodiment of the inventive concept.

FIG. 3B is a diagram illustrating a read operation of the display device according to an exemplary embodiment of the inventive concept. For the sake of description, FIG. 3B illustrates only configurations and signals involved in the operation of the controller 100 during the second period to read the correction data CDAT.

Referring to FIG. 3B, during the second period, the terminal unit 140 may receive the first data DAT1 and the control voltage CV from the external device. The terminal unit 140 may transmit the first data DAT1 to the timing controller 110. The terminal unit 140 may transmit the control voltage CV to the control voltage line CVL.

During the second period, the switch unit 120 may not receive the write signal WRS. Here, the switch unit 120 may be turned off.

During the second period, the power management unit 130 may be supplied with the control voltage CV from the terminal unit 140 through the control voltage line CVL. When the control voltage CV is supplied to the power management unit 130, the power management unit 130 may supply the memory voltage MV to the memory voltage line MVL. Thereby, the memory 200 may be supplied with the memory voltage MV through the memory voltage line MVL and driven by the memory voltage MV. Furthermore, the power management unit 130 may additionally supply power to various drivers other than the memory 200.

During the second period, the timing controller 110 may receive the first data DAT1 from the terminal unit 140. The timing controller 110 may communicate with the memory 200 through the interface line IFL. The timing controller 110 may read the correction data CDAT from the memory 200 through the interface line IFL. The timing controller 110 may correct the first data DAT1, based on the correction data CDAT. The timing controller 110 may generate the second data DAT2 by correcting the first data DAT1. The timing controller 110 may transmit the second data DAT2 and the data driving control signal DCS to the data driver 300.

In this way, the read operation of the display device for reading the correction data CDAT from the memory 200 may be performed.

Figure 4:
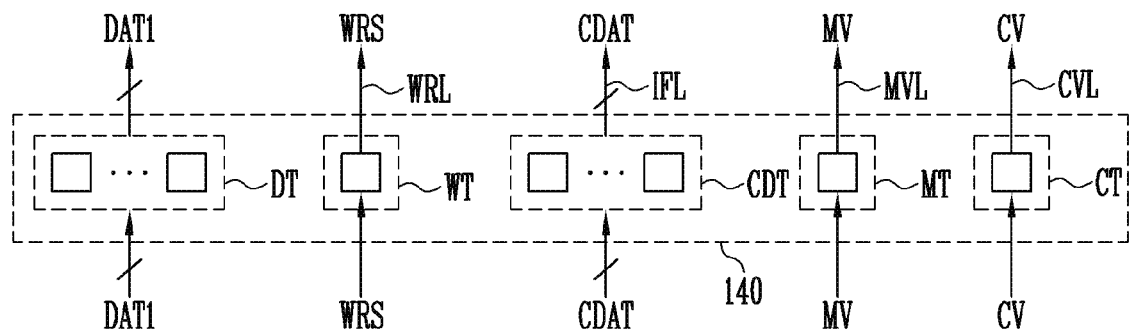
FIG. 4 is a diagram illustrating a terminal unit of FIG. 2 according to an exemplary embodiment of the inventive concept.

FIG. 4 is a diagram illustrating a terminal unit of FIG. 2 according to an exemplary embodiment of the inventive concept.

Referring to FIG. 4, the terminal unit 140 may include a data terminal DT, a write terminal WT, a correction data terminal CDT, a memory terminal MT, and a control terminal CT.

The data terminal DT may receive the first data DAT1 and transmit it to the corresponding component. In an exemplary embodiment of the inventive concept, the data terminal DT may include a plurality of terminals.

The write terminal WT may receive the write signal WRS and transmit it to the write signal line WRL.

The correction data terminal CDT may receive the correction data CDAT and transmit it to the interface line IFL. In an exemplary embodiment of the inventive concept, the correction data terminal CDT may include a plurality of terminals.

The memory terminal MT may receive the memory voltage MV and transmit it to the memory voltage line MVL.

The control terminal CT may receive the control voltage CV and transmit it to the control voltage line CVL.

For example, the correction data terminal CDT and the memory terminal MT may be integrated with each other to correspond to a single socket. Alternatively, in an exemplary embodiment of the inventive concept, the write terminal WT, the correction data terminal CDT, and the memory terminal MT may be integrated with one another to correspond to a single socket.

Figure 5:
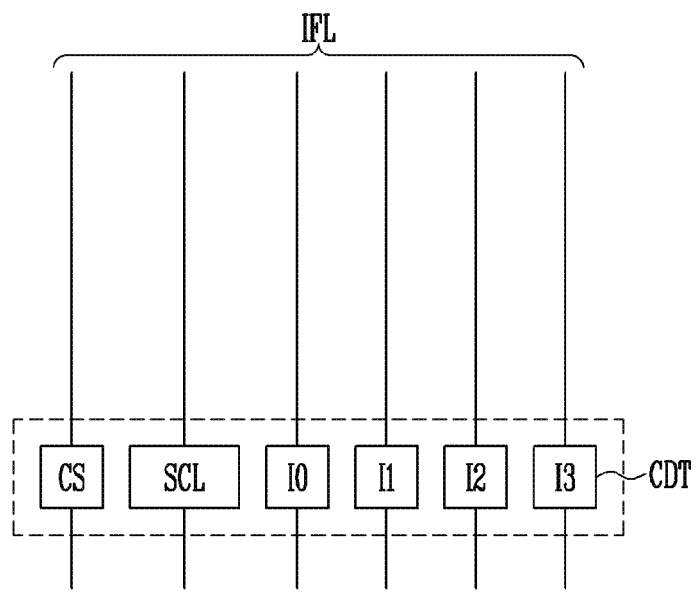
FIG. 5 is a diagram illustrating a correction data terminal of FIG. 4 according to an exemplary embodiment of the inventive concept.

FIG. 5 is a diagram illustrating a correction data terminal of FIG. 4 according to an exemplary embodiment of the inventive concept.

Referring to FIG. 5, the correction data terminal CDT may be coupled to the interface line IFL. In detail, the correction data terminal CDT may include a plurality of terminals. Each of the plurality of terminals may correspond to an associated one of lines included in the interface line IFL.

For example, the interface line IFL may include signal transmission lines using the SPI communication scheme.

The SPI communication scheme may perform communication using six lines corresponding to a chip select signal CS, a serial clock signal SCL, and input/output signals I0 to I3.

While the chip select signal CS is supplied, the SPI communication may start. The serial clock signal SCL may be used when a master informs a slave of a timing of data transmission. The input/output signals I0 to I3 may refer to transmission data between the master and the slave. In an exemplary embodiment of the inventive concept, data may be transmitted in two ways (e.g., both directions).

In an exemplary embodiment of the inventive concept, the interface line IFL may include six lines. The chip select signal CS, the serial clock signal SCL, and the input/output signals I0 to I3 may be supplied to respective lines through the correction data terminal CDT.

In FIG. 5, for the sake of description, the correction data terminal CDT has been illustrated as having the six terminals, but the inventive concept is not limited thereto. In an exemplary embodiment of the inventive concept, the number of terminals of the correction data terminal CDT may be changed in various ways.

Figure 6A:
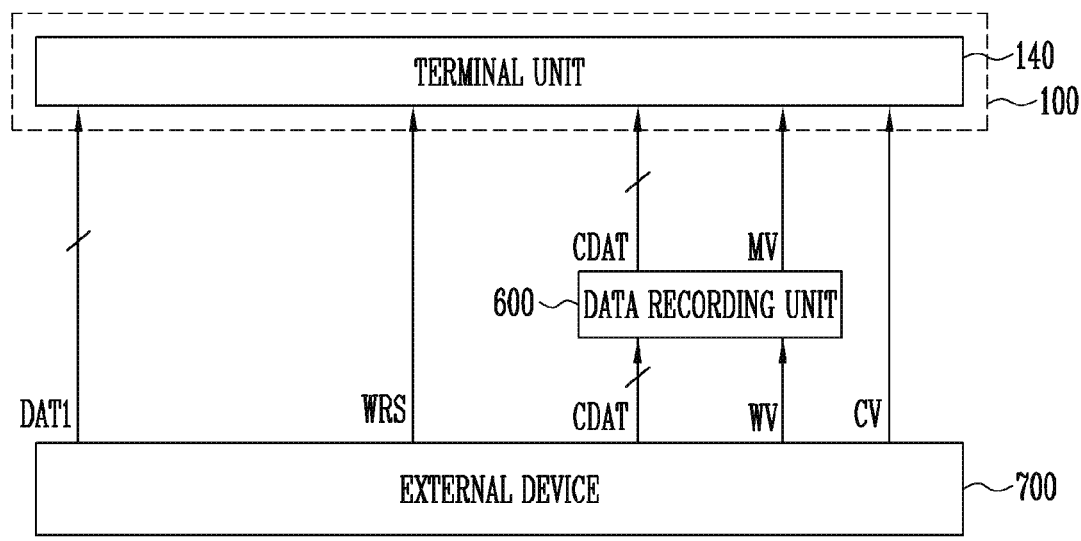
FIGS. 6A and 6B are diagrams illustrating a connection relationship between the display device of FIG. 1 and an external device according to an exemplary embodiment of the inventive concept.
Figure 6B:
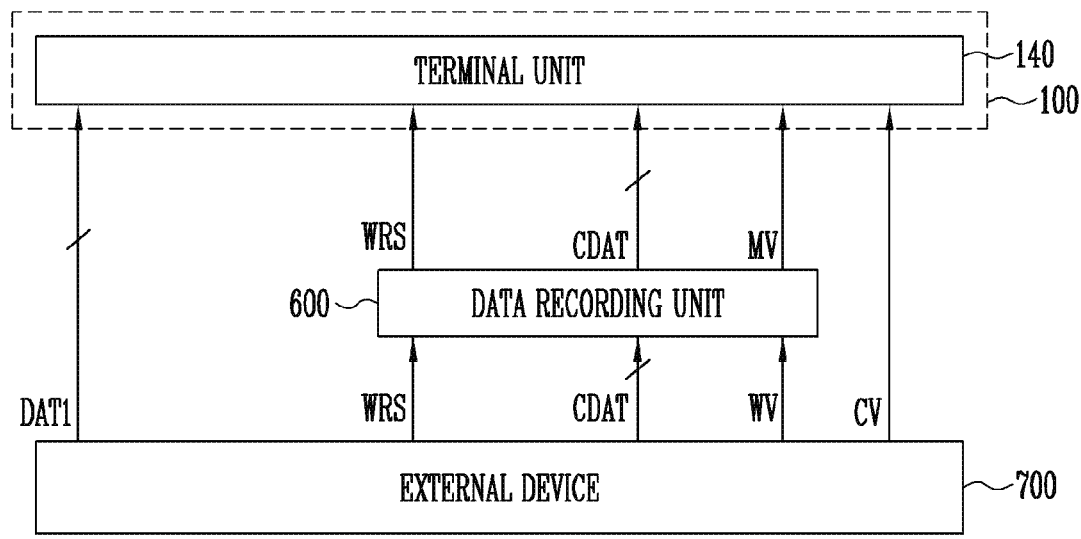

FIGS. 6A and 6B are diagrams illustrating a connection relationship between the display device of FIG. 1 and an external device according to exemplary embodiments of the inventive concept.

Referring to FIG. 6A, an external device 700 may transmit the first data DAT1 and the write signal WRS to the terminal unit 140. The external device 700 may transmit the correction data CDAT to a data recording unit 600.

The external device 700 may supply the write voltage WV to the data recording unit 600. The write voltage WV may be a voltage for driving the data recording unit 600.

The external device 700 may supply the control voltage CV to the terminal unit 140.

The data recording unit 600 may be driven by the write voltage WV supplied from the external device 700. The data recording unit 600 may receive the correction data CDAT and transmit it to the terminal unit 140.

The following description of the exemplary embodiment of FIG. 6B will be focused on differences from that of the exemplary embodiment of FIG. 6A to prevent repetitive description.

Referring to FIG. 6B, the external device 700 may transmit the write signal WRS to the data recording unit 600. The data recording unit 600 may receive the write signal WRS from the external device 700 and transmit it to the terminal unit 140.

In other words, the data recording unit 600 in FIG. 6B may receive the write signal WRS from the external device 700 and transmit the write signal WRS to the terminal unit 140, unlike the data recording unit 600 in FIG. 6A.

Although in FIGS. 6A and 6B, the data recording unit 600 and the external device 700 have been illustrated as being separately provided, the inventive concept is not limited thereto. In an exemplary embodiment of the inventive concept, the data recording unit 600 and the external device 700 may be integrated with each other.

Figure 7:
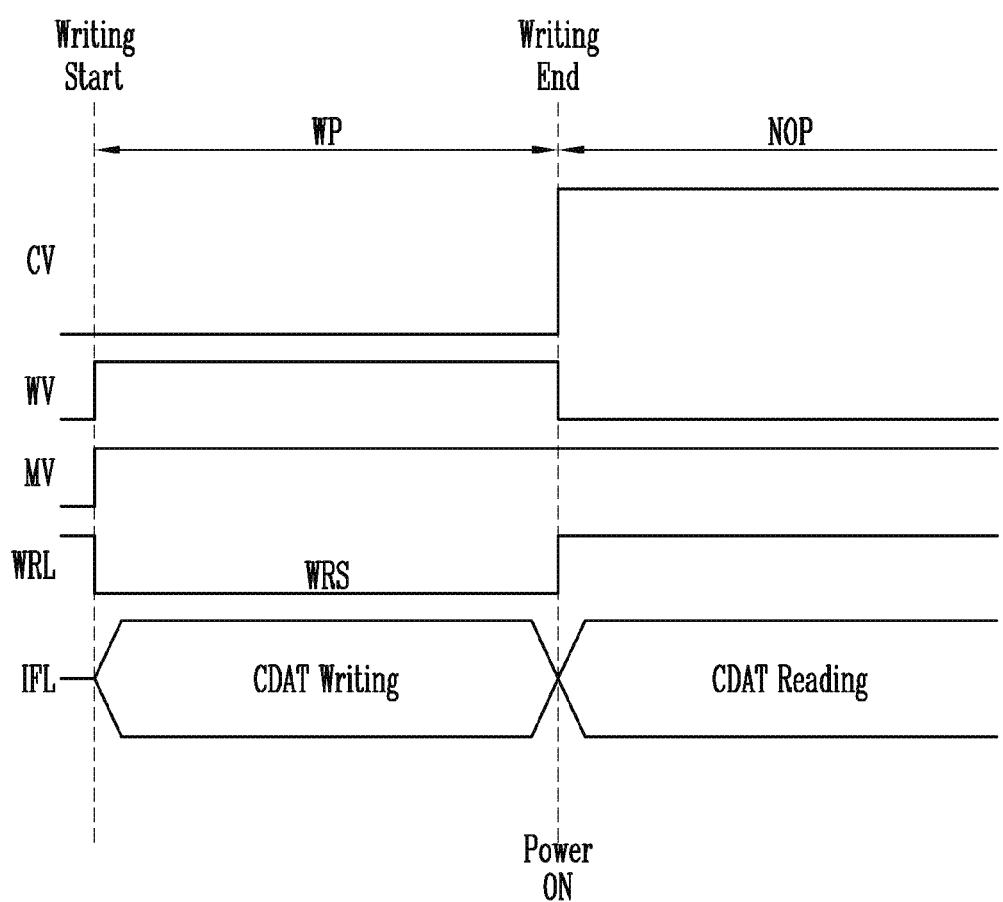
FIG. 7 is a timing diagram illustrating a method of driving the display device of FIG. 1 according to an exemplary embodiment of the inventive concept.

FIG. 7 is a timing diagram illustrating a method of driving the display device of FIG. 1 according to an exemplary embodiment of the inventive concept. In FIG. 7, for the sake of description, a first period WP and a second period NOP have been illustrated as continuing in succession, but the inventive concept is not limited thereto. In an exemplary embodiment of the inventive concept, the first period WP and the second period NOP may not be successive periods.

Referring to FIGS. 1 to 7, during the first period WP, the control voltage CV is not supplied. For example, the external device 700 may not supply the control voltage CV to the terminal unit 140 during the first period WP.

During the first period WP, the write voltage WV may be supplied. For example, the external device 700 may supply the write voltage WV to the data recording unit 600. The data recording unit 600 may be driven by the write voltage WV supplied thereto.

During the first period WP, the memory voltage MV may be supplied to the memory voltage line MVL. For example, when the write voltage WV is supplied, the data recording unit 600 may supply the memory voltage MV to the memory voltage line MVL. Thus, the memory 200 may be driven by the memory voltage MV supplied thereto.

During the first period WP, the write signal WRS may be supplied to the write signal line WRL. For example, the timing controller 110 and the switch unit 120 may receive the write signal WRS through the write signal line WRL. Here, the timing controller 110 may be disabled, and the switch unit 120 may be turned on. When the switch unit 120 is turned on, the terminal unit 140 and the memory 200 may be electrically connected to each other through the interface line IFL. Although in FIG. 7 the write signal WRS has been illustrated as having a low-level voltage, the inventive concept is not limited thereto. In an exemplary embodiment of the inventive concept, the write signal WRS may have a high-level voltage.

During the first period WP, the correction data CDAT is written to the memory 200. For example, the memory 200 may receive the correction data CDAT transmitted through the interface line IFL and store the correction data CDAT therein.

When the write operation is terminated, the supply of the write voltage WV is interrupted, whereby the supply of the memory voltage MV may also be interrupted. Furthermore, the supply of the write signal WRS may be interrupted.

During the second period NOP, the control voltage CV may be supplied from the external device 700 to the power management unit 130 through the terminal unit 140. In the present exemplary embodiment, the supply of the control voltage CV to the power management unit 130 may indicate that the display device DD is powered on. The power management unit 130 may supply the memory voltage MV to the memory voltage line MVL, based on the control voltage CV. Therefore, during the second period NOP after the first period WP, the memory 200 may also be supplied with and driven by the memory voltage MV.

During the second period NOP, the timing controller 110 may read the correction data CDAT from the memory 200 through the interface line IFL. The timing controller 110 may correct the first data DAT1, based on the correction data CDAT. The timing controller 110 may generate the second data DAT2 by correcting the first data DAT1, and transmit the second data DAT2 to the data driver 300.

As described above, exemplary embodiments of the inventive concept may provide a display device capable of reducing the time it takes to write correction data to a memory. Since the time it takes to write the correction data to the memory is reduced, the process of manufacturing the display device may be improved.

While the inventive concept has been shown and described with reference to the exemplary embodiments thereof, it will be understood by those of ordinary skill in the art that various changes in form and details may be made thereto without departing from the spirit and scope of the inventive concept as set forth by the following claims.

What is claimed is:

1. A display device comprising:
   a memory configured to store correction data during a first period;
   a timing controller configured to generate second data by correcting first data using the correction data, during a second period; and
   a terminal unit configured to transmit, to the memory, the correction data and a memory voltage received from an external device, during the first period, wherein, during the first period, the memory is supplied with the memory voltage through a memory voltage line and driven by the memory voltage.

2. The display device of claim 1, wherein the terminal unit transmits a write signal received from the external device, to the timing controller through a write signal line during the first period.

3. The display device of claim 2, wherein, during the first period, the timing controller is disabled when receiving the write signal through the write signal line.

4. The display device of claim 3, wherein the terminal unit transmits the correction data to the memory through an interface line during the first period.

5. The display device of claim 4, wherein the interface line is connected in common to the terminal unit, the memory, and the timing controller, centering on a common node.

6. The display device of claim 5, further comprising a switch unit disposed on the interface line, connected between the common node and the terminal unit, and configured to turn on in response to the write signal.

7. The display device of claim 6, wherein the terminal unit receives the correction data and the memory voltage from a data recording unit.

8. The display device of claim 7, wherein the terminal unit receives the write signal from the external device.

9. The display device of claim 7, wherein the terminal unit receives the write signal from the data recording unit.

10. The display device of claim 1, further comprising a power management unit configured to supply the memory voltage to the memory voltage line during the second period.

11. The display device of claim 10, wherein, during the second period, the memory is supplied with the memory voltage through the memory voltage line, and driven by the memory voltage.

12. The display device of claim 1, further comprising:
a data driver configured to generate data signals using the second data and to supply the data signals to data lines;
a scan driver configured to supply scan signals to scan lines; and
pixels coupled to the scan lines and the data lines.

13. The display device of claim 1, wherein the memory comprises a flash memory.

14. A display device comprising:
a terminal unit configured to receive a write signal, correction data, and a memory voltage from an external device, transmit the write signal to a write signal line, transmit the correction data to an interface line, and transmit the memory voltage to a memory voltage line, during a first period to write the correction data;
a timing controller coupled to the write signal line and configured to be disabled in response to the write signal; and
a memory coupled to the memory voltage line and the interface line, and configured to be supplied with and driven by the memory voltage, and to receive and store the correction data.

15. The display device of claim 14, wherein the interface line is connected in common to the terminal unit, the memory, and the timing controller, centering on a common node.

16. The display device of claim 15, further comprising a switch unit disposed on the interface line, connected between the common node and the terminal unit, and configured to turn on in response to the write signal.

17. The display device of claim 14, wherein the interface line comprises a signal transmission line configured to use a serial peripheral interface communication scheme.

18. The display device of claim 14, wherein the write signal line comprises a signal transmission line of an inter-integrated circuit (I2C) interface.

19. The display device of claim 14, wherein the memory comprises a flash memory.

20. A display device comprising:
a terminal unit configured to transmit first data, a write signal, correction data, and a memory voltage;
a timing controller configured to receive the first data and the write signal, and connected to a common node via an interface line;
a memory configured to receive the correction data and the memory voltage, and connected to the common node via the interface line to receive the correction data; and
a switch unit connected between the terminal unit and the common node via the interface line, and configured to turn on in response to the write signal to electrically connect the terminal unit and the memory.

* * * * *